US008713512B2

(12) United States Patent
Schwarz et al.

(10) Patent No.: US 8,713,512 B2
(45) Date of Patent: Apr. 29, 2014

(54) SYSTEM FOR PROGRAMMING DOMESTIC APPLIANCES AND METHOD FOR PROGRAMMING ASSEMBLY-LINE PROGRAMMABLE DOMESTIC APPLIANCES

(75) Inventors: Marcos Guilherme Schwarz, Joinville-SC (BR); Carlos Alberto Teixeira, Joinville-SC (BR); Marcelo Zanelato, Joinville-SC (BR); Lucas Mondardo Cunico, Joinville-SC (BR)

(73) Assignee: Whirlpool S.A., Sao Paulo-SP (BR)

( * ) Notice: Subject to any disclaimer, the term of this patent is extended or adjusted under 35 U.S.C. 154(b) by 1146 days.

(21) Appl. No.: 12/282,944

(22) PCT Filed: Mar. 13, 2007

(86) PCT No.: PCT/BR2007/000060
§ 371 (c)(1),
(2), (4) Date: Mar. 9, 2009

(87) PCT Pub. No.: WO2007/104119
PCT Pub. Date: Sep. 20, 2007

(65) Prior Publication Data
US 2010/0017781 A1 Jan. 21, 2010

(30) Foreign Application Priority Data
Mar. 14, 2006 (BR) .................................... 0600823

(51) Int. Cl.
G06F 9/44 (2006.01)
G05B 19/18 (2006.01)
G05B 19/04 (2006.01)
G05B 19/418 (2006.01)
H03H 17/02 (2006.01)

(52) U.S. Cl.
CPC ................ *G05B 19/18* (2013.01); *G05B 19/04* (2013.01); *G05B 19/418* (2013.01); *H03H 17/0211* (2013.01); *H03H 17/0294* (2013.01)

USPC ........... 717/100; 716/100; 340/4.11; 340/4.3; 340/4.61; 340/4.62

(58) Field of Classification Search
CPC ............ G06F 9/44; G06F 9/443; G06F 9/445
USPC ....... 717/100; 607/9; 716/100; 340/4.11, 4.3, 340/4.61, 4.62
See application file for complete search history.

(56) References Cited

U.S. PATENT DOCUMENTS

| 6,721,581 | B1 * | 4/2004 | Subramanian ............. 455/575.1 |
|---|---|---|---|
| 6,990,548 | B1 | 1/2006 | Kaylor |
| 2004/0046637 | A1 * | 3/2004 | Wesby Van Swaay ......... 340/5.1 |
| 2004/0083471 | A1 | 4/2004 | Nam et al. |
| 2004/0204743 | A1 * | 10/2004 | McGrath et al. ................... 607/5 |
| 2005/0033819 | A1 * | 2/2005 | Gambino et al. ............. 709/213 |
| 2005/0131467 | A1 * | 6/2005 | Boveja .............................. 607/9 |
| 2005/0251227 | A1 | 11/2005 | Khoo et al. |

FOREIGN PATENT DOCUMENTS

| EP | 1 544 827 | 6/2005 |
|---|---|---|
| WO | WO 2006/035472 | 4/2006 |

OTHER PUBLICATIONS

The International Search Report for PCT Application No. PCT/BR2007/000060; Filed Mar. 13, 2007; Date of Completion Jul. 24, 2007; Date of Mailing Aug. 2, 2007.
The Written Opinion for PCT Application No. PCT/BR2007/000060; Filed Mar. 13, 2007; Date of Completion Jul. 24, 2007; Date of Mailing Aug. 2, 2007.
Notification of the Recording of a Change Mailed Aug. 15, 2007.
Reply to the Written Opinion Dated Jan. 9, 2008.
Additional Amendment in Reply to Written Opinion Dated Aug. 27, 2008.

* cited by examiner

*Primary Examiner* — Chat Do
*Assistant Examiner* — Lynda Dinh
(74) *Attorney, Agent, or Firm* — Alston & Bird LLP

(57) ABSTRACT

The present invention relates to a system for programming domestic appliances and a method for programming assembly-line programmable domestic appliances, especially a system wherein programming occurs without the physical connection between a transmission unit and a reprogrammable processor present in a processing unit integrated into the domestic appliance. The system for programming domestic appliances comprises a remote programming unit (UR) and a reprogrammable processor (PR) present in a processing unit (UP) integrated into the domestic appliance ($E_N$), the remote programming unit (UR) being provided with a data transmission device ($T_{UR}$) and the reprogrammable processor (PR) present in a processing unit (UP) being provided with a data receiving device ($R_{UP}$), and the data transmission and reception devices ($T_{UR}$, $R_{UP}$) are based on a magnetic field. The remote programming unit (UR) is loaded with at least one program code ($S_N$) to be transmitted by the data transmission device ($T_{UR}$) of the remote programming unit (UR) to the reprogrammable processor (PR) present in the processing unit (UP) of the domestic appliance ($E_N$). A method for programming assembly-line programmable domestic appliances is also disclosed, which is applicable to control the system object of the present invention.

5 Claims, 2 Drawing Sheets

SYSTEM FOR PROGRAMMING DOMESTIC APPLIANCES AND METHOD FOR PROGRAMMING ASSEMBLY-LINE PROGRAMMABLE DOMESTIC APPLIANCES

The present invention relates to a system for programming domestic appliances and a method for programming assembly-line programmable domestic appliances, especially a system wherein programming occurs without the physical connection between a transmission unit and a reprogrammable processor integrated into the domestic appliance.

DESCRIPTION OF THE PRIOR ART

The programming of reprogrammable processors in the production line or in the field where the appliance is located during use, is currently implemented by means of the physical contact of a set of needles existing in the programming equipment, which touch specific points of the electronic circuit containing the reprogrammable processor.

Another technique comprehends physical contact between a connector of the programming equipment and a connector positioned at the electronic circuit containing the reprogrammable processor. These two techniques have the disadvantage of requiring a physical connection between the programming equipment and the electronic control.

A third technique consists of the manual choice of configurations in a set of mechanical selection devices, such as resistors and dip switches, located in the electronic control. This procedure is disadvantageous because requires physical contact between the operator that makes the configuration and the mechanical selection devices.

In the two last techniques mentioned, it is quite common that the physical contact requires the removal of screws and actuation in mechanical locks, disassembly of plastic parts and disengagement of connections, to enable access to the electronic circuit, making the large scale production process more expensive and with lower quality.

Another alternative is the use of previously recorded processors, with the disadvantage of not allowing changes in their configuration. Another technique is programming domestic devices without the physical connection, for instance, making use of infrared or electromagnetic waves. An example of this type of solution is found in document EP1544827, which discloses a wireless communication system for centralized programming of domestic appliances. This system, however, does not foresee the possibility of carrying out the domestic appliance programming in the production line, nor does it anticipate the possibility of using magnetic field programming, therefore, being susceptible to the interference of an electromagnetic field that may affect the equipment.

BRIEF DESCRIPTION AND OBJECTIVES OF THE INVENTION

The present invention has as its objective a system and method for programming reprogrammable processors, composed of an electronic control having at least one remote programming unit provided with a data transmission device; and one reprogrammable processor, located in a domestic appliance provided with a data receiving device, these transmission and reception devices transmitting program codes through a wireless connection using a magnetic field-based transmission means.

During the process of producing domestic appliances, the electronic controls containing embedded processors may be basically of two types: fixed programming or reprogrammable.

In the case of electronic controls with fixed programming, an association must be established between the domestic appliance model and the electronic control model suitable for this equipment. This situation has the disadvantage of requiring high stock management in order to avoid errors and reprocessing.

In the case of reprogrammable electronic controls, the situation may be divided into two groups: with physical contact between the programming device and the equipment to be programmed and without physical contact between these elements. The solutions with physical contact have the disadvantages of commonly presenting inefficient electric contacts or damage caused by operator's handling and in some cases requiring the disassembly of equipment parts, reducing quality and burdening the productive process.

On the other hand, the solution without physical contact is normally made by infrared or electromagnetic waves. The infrared technique has the disadvantage of requiring visual access between the programming device and the equipment being programmed. The use of electromagnetic waves is disadvantageous not only because it is susceptible to the influence of interferences that may generate difficulties in data transmission or even cause inappropriate programming but also because it requires higher cost electronic components that operate in high frequency.

The system and method proposed herein, based on a magnetic field with a receiver circuit tuned to low frequency and with a low amplification gain stage, is free from the disadvantages found in the abovementioned techniques.

A simple, low-cost electronic receiver circuit is used, which may thus be added to each product unit produced in large scale. This receiver circuit has a resonating inductor-capacitor structure, which senses the presence of a magnetic field generating an induced voltage. At the resonating frequency, this voltage has maximum amplitude. A common-emitter configuration amplifier stage receives this induced voltage, amplifies it and makes it available to a rectification and filtering circuit, which eliminates the high-frequency component. At last, a voltage equalization stage receives the induced signal that was treated by the previous stages, generating voltage values suitable for processors' digital inputs.

These objects are achieved by means of a system for programming domestic appliances comprising a remote programming unit and a processing unit integrated into the domestic appliance which contains a reprogrammable processor, the remote programming unit being provided with a data transmission device, and the processing unit containing the reprogrammable processor being provided with a data receiving device, these transmission and reception devices being based on a magnetic field, and the remote programming unit being loaded with at least one program code to be transmitted by the data transmission device of the remote programming unit to the data receiving device of the processing unit containing the domestic appliance reprogrammable processor.

The objects of the present invention are further achieved by means of a method for programming assembly-line programmable domestic appliances, characterized in that it is applicable to a system comprising a remote programming unit and a reprogrammable processor provided in a processing unit integrated into the domestic appliance, said method comprising the steps of loading the remote programming unit with at least one program code from a program code library and transmitting data of the program code(s) to the reprogrammable processor of the processing unit through a magnetic field as a plurality of domestic appliances is passed on front of the remote programming unit.

BRIEF DESCRIPTION OF THE DRAWINGS

The present invention will be further described in more details based on one example of embodiment represented in the drawings. The figures show.

DETAILED DESCRIPTION OF DRAWINGS

Figure 1:
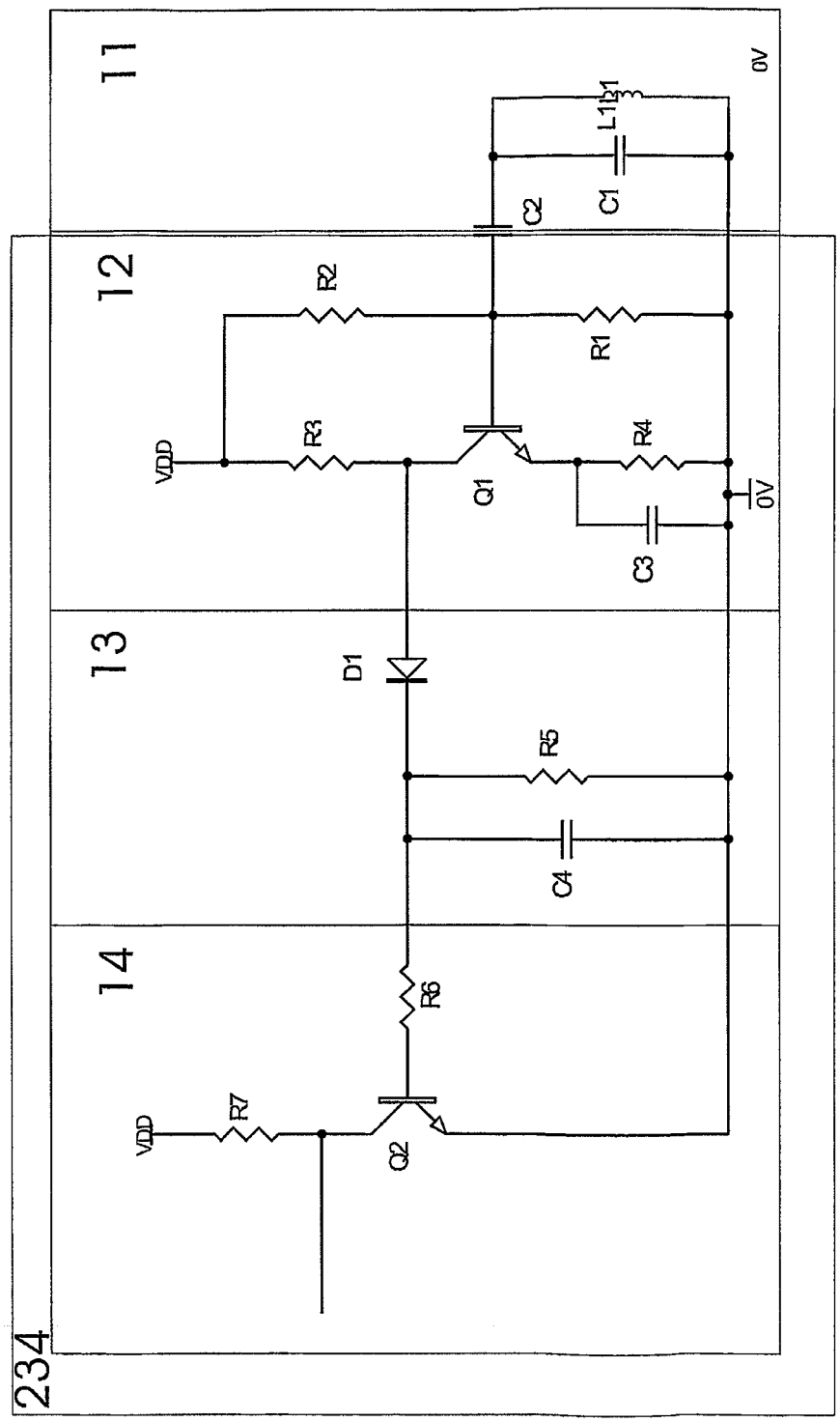
FIG. 1 represents an electronic circuit of the data receiving device according to one of the embodiments of the present invention.
Figure 2:
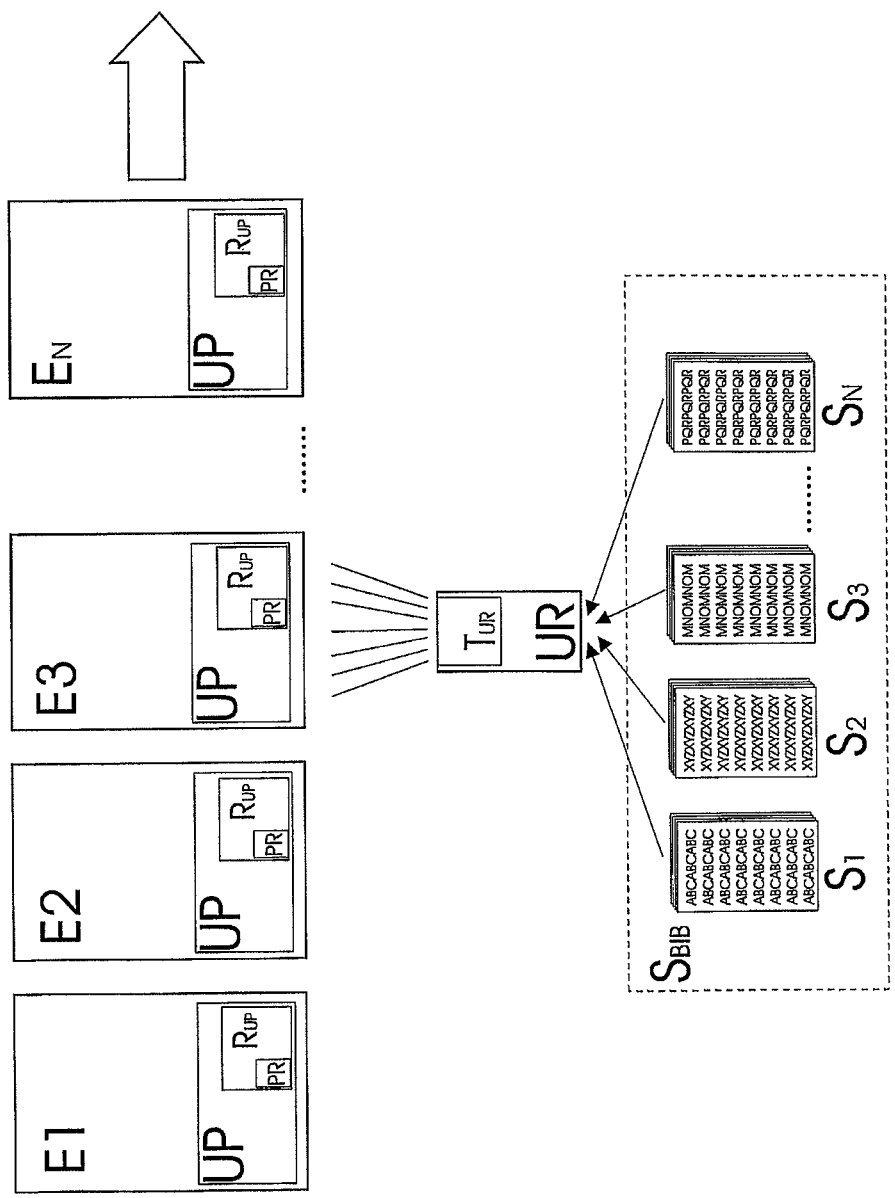
FIG. 2 is a schematic drawing of the domestic appliance programming system in the production line, which is the object of the present invention.

As may be seen in FIGS. 1 and 2, the domestic appliance programming system, object of the present invention, comprises a remote programming unit UR and a reprogrammable processor PR that is integrated into the domestic appliance $E_N$.

As may be seen in FIG. 2, the remote programming unit UR is provided with a data transmission device $T_{UR}$, and each one of the processing units UP contains one or more reprogrammable processors PR connected to a data receiving device $R_{UP}$, the data transmission and reception devices ($T_{UR}$, $R_{UP}$) being based on magnetic field.

The system further provides a library $S_{LIB}$, which stores several program codes $S_N$ that can be transmitted by the remote programming unit UR to the reprogrammable processor PR of the processing unit UP through the data transmission and reception devices ($T_{UR}$, $R_{UP}$).

In this sense, it is possible, for instance, that one or more of the several program codes $S_1$, $S_2$ ... $S_N$ of library $S_{LIB}$ is loaded into the remote programming unit UR, which can transmit these codes to the reprogrammable processor PR of the processing unit UP, for example, during the manufacture of the domestic appliance or even after its manufacture, so that the program code $S_N$ is updated, when needed. FIG. 2 schematically illustrates that domestic appliances $E_1$, $E_2$, $E_3$ ... $E_N$ may be programmed at the assembly line phase, only by positioning the remote programming unit UR properly.

With regard to the configuration of the data transmission and reception devices ($T_{UR}$, $R_{UP}$), these are based on a magnetic field, considering the advantages that this type of transmission brings to the present invention be seen in FIG. 1, one embodiment of the data receiving device $R_{UP}$ provides a topology comprising a passive circuit sensitive to magnetic fields 11 and an active circuit for the treatment of signals 234, the active circuit for the treatment of signals 234 being responsible for converting the electric signals provided by the passive circuit sensitive to magnetic fields 11 into electric signals compatible with the reprogrammable processor PR of the processing unit UP.

The passive circuit sensitive to magnetic fields 11 comprises a resonating inductor-capacitor topology being composed of inductor $L_1$ and capacitor $C_1$, configured to be tuned to low frequency and, more preferably, to the frequency range of 1 kHz to 530 kHz.

The syntony of the circuit sensitive to magnetic fields 11 of the data receiving device $R_{UP}$ is particularly advantageous in the present application, because the magnetic field has a rapidly decaying intensity, at the ratio of:

$$\text{decay} = \frac{1}{d^3}$$

Hence, the circuit sensitive to magnetic field 11 of the data receiving device $R_{UP}$ has a typical sensitivity of only up to 10 cm, making it resistant against the influence of electromagnetic waves, because these act at a higher frequency range, considering that, for tuning an electromagnetic wave to low frequency, the antenna would have to be sized in kilometers, which is unfeasible in practice.

The active circuit for the treatment of signals 234 comprises an amplification stage in the common-emitter configuration 12 composed of a transistor $Q_1$, resistors $R_1$, $R_2$, $R_3$ and $R_4$ and capacitor $C_3$; a rectification and filtering stage 13 composed of a diode $D_1$, resistor $R_5$ and capacitor $C_4$ to convert the signal read in the data receiving device $R_{UP}$ at DC level and further cut off the high frequencies; and an equalization stage of voltage levels 14 composed of a transistor $Q_2$ and resistors $R_6$ and $R_7$, which is configured to work with the cut-off and saturation of transistor $Q_2$, so as to have logic level 1 or 0 as input for the reprogrammable processor PR of the processing unit UP.

Furthermore, the active circuit for the treatment of signals 234 should be configured to have low amplification gain and, preferably, to have an amplification gain in a range of 10 to 20.

With the configuration presented in the system of the present invention, the objects of the invention are achieved since the cited configuration has a low-cost system and eliminates wired connections, uses a dip switch, eliminates the risks of interference by electromagnetic signals and is able to effectively program domestic appliances in the production line or afterwards.

With regard to the methodology to control the system object of the present invention, the following steps should be foreseen, especially in case of programming assembly-line programmable domestic appliances. The steps comprise:

loading the remote programming unit UR with at least one program code $S_N$ from a library of program codes $S_N$;

transmitting data of the program code(s) $S_N$ through a magnetic field to a reprogrammable processor PR of the processing unit UP as a plurality of domestic appliances $E_N$ is passed on front of the remote programming unit UR.

Thus, it is possible to program large quantities of domestic appliances $E_N$ in a fast and cheap manner.

Furthermore, it is possible to foresee that the data transmission and reception devices ($T_R$, $R_{UP}$) will operate both ways in order not only to program the domestic appliances $E_N$ but also receive status information.

Having described examples of the invention with reference to its preferred embodiments, it is to be understood that the scope of the present invention embraces other possible variations, being limited solely by the appended claims, including the possible equivalents therein.

The invention claimed is:

1. A system for programming domestic appliances during a manufacturing process, characterized by comprising:
   a remote programming unit that is physically separate and remote from the domestic appliance being programmed; and
   a processing unit integrated into the domestic appliance containing a reprogrammable processor;

the remote programming unit being provided with a data transmission device and the processing unit containing the reprogrammable processor being provided with a data receiving device;

the remote programming unit being loaded with at least one program code to be wirelessly transmitted by the data transmission device of the remote programming unit to the data receiving device of the processing unit containing the reprogrammable processor of the domestic appliance, the remote programming unit being configured to transmit the program code at the assembling line as a plurality of domestic appliances is passed in front of it;

wherein the data is transmitted between the data transmission and data receiving devices by a magnetic field generating an induced voltage in the data receiving device;

wherein the data receiving device comprises a passive circuit sensitive to magnetic fields and an active circuit for the treatment of signals, wherein the passive circuit sensitive to magnetic fields comprises a resonating inductor-capacitor topology, and the active circuit comprises an amplification stage in a common-emitter configuration, a rectification and filtering stage and an equalization stage of voltage levels, the active circuit for the treatment of signals converting electric signals provided by the passive circuit into electric signals compatible with the reprogrammable processor of the processing unit, and wherein the passive circuit sensitive to magnetic fields is tuned to a frequency range of 1 kHz to 530 kHz.

2. A system for programming domestic appliances according to claim 1, wherein the active circuit for the treatment of signals is configured to have amplification gain in a range of 10 to 20.

3. A method for programming assembly-line programmable domestic appliances, applicable to a system comprising a remote programming unit; and a reprogrammable processor provided in a processing unit integrated into the domestic appliance, said method comprising the steps of:

loading the remote programming unit with at least one program code from a library of program codes;

transmitting wirelessly data of the program code to the reprogrammable processor of the processing unit as a plurality of domestic appliances is passed on front of the remote programming unit at the assembling line;

wherein the data is transmitted between the data transmission and data receiving devices by a magnetic field generating an induced voltage in the data receiving device;

wherein the transmission of the data of the program code to the reprogrammable processor of the processing unit is done with a passive circuit sensitive to magnetic fields and an active circuit for the treatment of signals, wherein the passive circuit sensitive to magnetic fields comprises a resonating inductor-capacitor topology, and the active circuit comprises an amplification stage in a common-emitter configuration, a rectification and filtering stage and an equalization stage of voltage levels, wherein the active circuit for the treatment of signals converts electric signals provided by the passive circuit into electric signal compatible with the reprogrammable processor of the processing unit and the passive circuit is tuned to a frequency range of 1 kHz to 530 kHz and generates an induced voltage carrying the data in the reprogrammable processor.

4. A method according to claim 3, wherein the data transmission of the program code(s) to the reprogrammable processor of the processing unit is done with an amplification gain in a range of 10 to 20.

5. A system for programming domestic appliances during a manufacturing process, comprising;

a remote programming unit; and a processing unit integrated into the domestic appliance containing a reprogrammable processor;

the remote programming unit being provided with a data transmission device and the processing unit containing the reprogrammable processor being provided with a data receiving device;

the data transmission and receiving devices being based on a magnetic field; and the remote programming unit being loaded with at least one program code to be wirelessly transmitted by the data transmission device of the remote programming unit to the data receiving device of the processing unit containing the reprogrammable processor of the domestic appliance, the remote programming unit being configured to transmit the program code-at the assembling line as a plurality of domestic appliances is passed in front of it, wherein the data receiving device is comprised by a passive circuit sensitive to magnetic fields but not sensitive to electromagnetic waves, and an active circuit for the treatment of signals, wherein the passive circuit sensitive to magnetic fields comprises a resonating inductor-capacitor topology, and the active circuit comprises an amplification stage in a common-emitter configuration, a rectification and filtering stage and an equalization stage of voltage levels, the active circuit for the treatment of signals converting electric signals provided by the passive circuit into electric signals compatible with the reprogrammable processor of the processing unit, the passive circuit being tuned to a frequency range of 1 kHz to 530 kHz.

* * * * *

UNITED STATES PATENT AND TRADEMARK OFFICE
CERTIFICATE OF CORRECTION

PATENT NO. : 8,713,512 B2  Page 1 of 1
APPLICATION NO. : 12/282944
DATED : April 29, 2014
INVENTOR(S) : Schwarz et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1453 days.

Signed and Sealed this

Twenty-ninth Day of September, 2015

Michelle K. Lee
*Director of the United States Patent and Trademark Office*